United States Patent
Yamaguchi et al.

(10) Patent No.: US 6,272,763 B1
(45) Date of Patent: *Aug. 14, 2001

(54) STAGING APPARATUS AND METHOD, AND METHOD FOR MANUFACTURING THE STAGING APPARATUS, AND EXPOSING APPARATUS USING THE STAGING APPARATUS

(75) Inventors: Atsushi Yamaguchi, Chigasaki; Shigeru Yamasaki, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/400,540

(22) Filed: Sep. 21, 1999

Related U.S. Application Data

(63) Continuation of application No. 09/122,754, filed on Jul. 27, 1998, now Pat. No. 5,983,513, which is a continuation of application No. 08/593,934, filed on Jan. 30, 1996, now Pat. No. 5,832,620, which is a division of application No. 08/481,203, filed on Jun. 7, 1995, now Pat. No. 5,502,899, which is a continuation of application No. 08/426,482, filed on Apr. 20, 1995, now abandoned, which is a continuation of application No. 08/183,878, filed on Jan. 21, 1994, now abandoned.

(30) Foreign Application Priority Data

Jan. 21, 1993 (JP) .................................................. 5-008193

(51) Int. Cl.[7] .................................................. G01B 5/004
(52) U.S. Cl. .............................. 33/568; 33/573; 33/1 M
(58) Field of Search .............................. 33/568, 573, 1 M

(56) References Cited

U.S. PATENT DOCUMENTS

| | | | |
|---|---|---|---|
| 4,525,659 | * 6/1985 | Imahashi et al. | 318/649 |
| 4,821,205 | 4/1989 | Schutten et al. | 364/508 |
| 4,941,265 | * 7/1990 | Heiland | 33/568 |
| 5,030,901 | * 7/1991 | Futami | 318/611 |
| 5,172,160 | 12/1992 | Van Eijk et al. | 355/53 |
| 5,251,863 | * 10/1993 | Gossman et al. | 248/550 |
| 5,502,899 | * 4/1996 | Yamaguchi et al. | 33/568 |
| 5,832,620 | * 11/1998 | Yamaguchi et al. | 33/568 |
| 5,983,513 | * 11/1999 | Yamaguchi et al. | 33/568 |

FOREIGN PATENT DOCUMENTS

| | | | |
|---|---|---|---|
| 468547 | * 1/1992 | (EP) | 248/638 |
| 2-1585 | 1/1990 | (JP) . | |

OTHER PUBLICATIONS

Abstract of Japanese Patent Application Laid–Open No. 2–1585, Jan. 5, 1990—Kobayashi.

* cited by examiner

*Primary Examiner*—Christopher W. Fulton
(74) *Attorney, Agent, or Firm*—Miles & Stockbridge P.C.

(57) ABSTRACT

A positioning staging apparatus comprises a base provided on a floor, a stage provided on the base and movable to the base, an output unit for outputting stage positioning information for moving the stage to a predetermined target position, a stage drive unit provided on the base for driving the stage and outputting the drive information, a stage control unit for controlling the stage drive unit to accelerate and decelerate the stage in accordance with the stage positioning information to stop the stage at the target position, a stage displacement detection unit for detecting the displacement of the stage driven by the stage drive unit to output the stage displacement information, and an anti-vibration unit provided between the floor and the base for applying to the base a force to suppress the vibration of the base generated by the movement of the stage. The anti-vibration unit generates the suppression force in accordance with one of the stage displacement information and the stage positioning information. A method for manufacturing a staging apparatus and a method for controlling movement of a stage are also provided.

43 Claims, 2 Drawing Sheets

STAGING APPARATUS AND METHOD, AND METHOD FOR MANUFACTURING THE STAGING APPARATUS, AND EXPOSING APPARATUS USING THE STAGING APPARATUS

CROSS-REFERENCE TO RELATED APPLICATIONS

This application is a continuation of application Ser. No. 09/122,754 filed Jul. 27, 1998 (now U.S. Pat. No. 5,983,513 issued Nov. 16, 1999); which is a continuation of application Ser. No. 08/593,934 filed Jan. 30, 1996 (now U.S. Pat. No. 5,832,620 issued Nov. 10, 1998), which is a division of application Ser. No. 08/481,203 filed Jun. 7, 1995 (now U.S. Pat. No. 5,502,899 issued Apr. 2, 1996); which is a continuation of application Ser. No. 08/426,482 filed Apr. 20, 1995 (abandoned), which is a continuation of application Ser. No. 08/183,878 filed Jan. 21, 1994 (abandoned).

BACKGROUND OF THE INVENTION

1. Field of the Invention

The present invention relates to a staging apparatus having an anti-vibration mechanism which is suitable for use with a stage for positioning a photo-sensitive substrate in a projection exposure apparatus or a stage for moving an object while it carries the object in a measurement instrument. The present invention also relates to a method for controlling movement of a stage which controls a device that suppresses a vibration of the stage, and a method for manufacturing the staging apparatus.

2. Related Background Art

When a semiconductor device or a liquid crystal display device is to be manufactured in a photo-lithography process, a projection exposure apparatus which exposes a pattern image of a photo-mask or a reticle onto a photo-sensitive substrate by a step and repeat process through a projection optical system is used. In such a projection exposure apparatus, since it is required to precisely position the photo-sensitive substrate, a stage which mounts the photo-sensitive substrate and moves it three-dimensionally is used.

In the prior art projection exposure apparatus, in order to prevent an external disturbance from the external of the apparatus and an internal vibration generated in the apparatus from deteriorating performances of the projection exposure apparatus, the entire projection exposure apparatus is mounted on a vibration attenuation apparatus called an anti-vibration table. However, as the size of the photo-sensitive substrate increases, the weight of a moving portion of the stage increases, and as the speed of the stage increases, a counterforce applied to the anti-vibration table (the entire apparatus) from the stage increases more and more. As the counterforce increases more and more, a vibration amplitude generated in the anti-vibration table increases, and the vibration acts to the stage to lead to the deterioration of a settling time of the positioning of the stage (a time required for a positional deviation of the stage from a target position to reach substantially zero) and a stop precision.

In order to improve the settling time of the positioning of the stage and the stop precision, an active anti-vibration mechanism which detects the generated vibration by a gradient sensor or an acceleration sensor and actively controls the detected vibration by an actuator may be used. By the use of such an anti-vibration mechanism, the reduction of the vibration settling time in the anti-vibration table may be expected and the improvement of the stage performance may be expected.

However, even when the active anti-vibration mechanism is adopted, the anti-vibration is still based on a principle that the generated vibration is converted to an electrical signal by a sensor and the detected signal is fed back to the actuator. Accordingly, a response time before the suppression of the generated vibration is not short enough and the tracking property of the anti-vibration operation to the generated vibration is poor.

SUMMARY OF THE INVENTION

It is an object of the present invention to provide a staging apparatus having a shorter settling time by the adoption of an active anti-vibration mechanism.

It is another object of the present invention to provide a staging apparatus having an improved positioning performance of the stage.

It is still another object of the present invention to provide a method for manufacturing a staging apparatus that achieves the aforementioned objects of the present invention.

It is yet another object of the present invention to provide a method for controlling movement of a stage that achieves the aforementioned objects of the present invention.

The positioning staging apparatus of the present invention comprises a base provided on a floor; a stage provided on said base and movable to said base; output means for outputting stage positioning information for moving said stage to a predetermined target position; stage drive means provided on said base for driving said stage and outputting the drive information; stage control means for controlling said stage drive means to accelerate and decelerate said stage in accordance with the stage positioning information to stop said stage at the target position; stage displacement detection means for detecting the displacement of said stage driven by said stage drive means to output the stage displacement information; and anti-vibration means provided between said floor and said base for applying to said base a force to suppress the vibration of said base generated by the movement of said stage. The anti-vibration means generates the suppression force in accordance with one of the stage displacement information and the stage positioning information.

In accordance with the present invention, since the anti-vibration control means controls the operation of the anti-vibration buffer means by using the displacement information of the stage, the vibration settling time for the movement of the stage is shortened and the positioning performance of the stage is improved.

When the stage control means controls the movement of the stage by utilizing the vibration status of the base, the positioning precision of the stage is further improved.

DETAILED DESCRIPTION OF THE PREFERRED EMBODIMENTS

One embodiment of the staging apparatus of the present invention is now explained with reference to FIGS. 1 and 2. In the present embodiment, the present invention is applied to a staging apparatus having an active anti-vibration mechanism.

Figure 1:
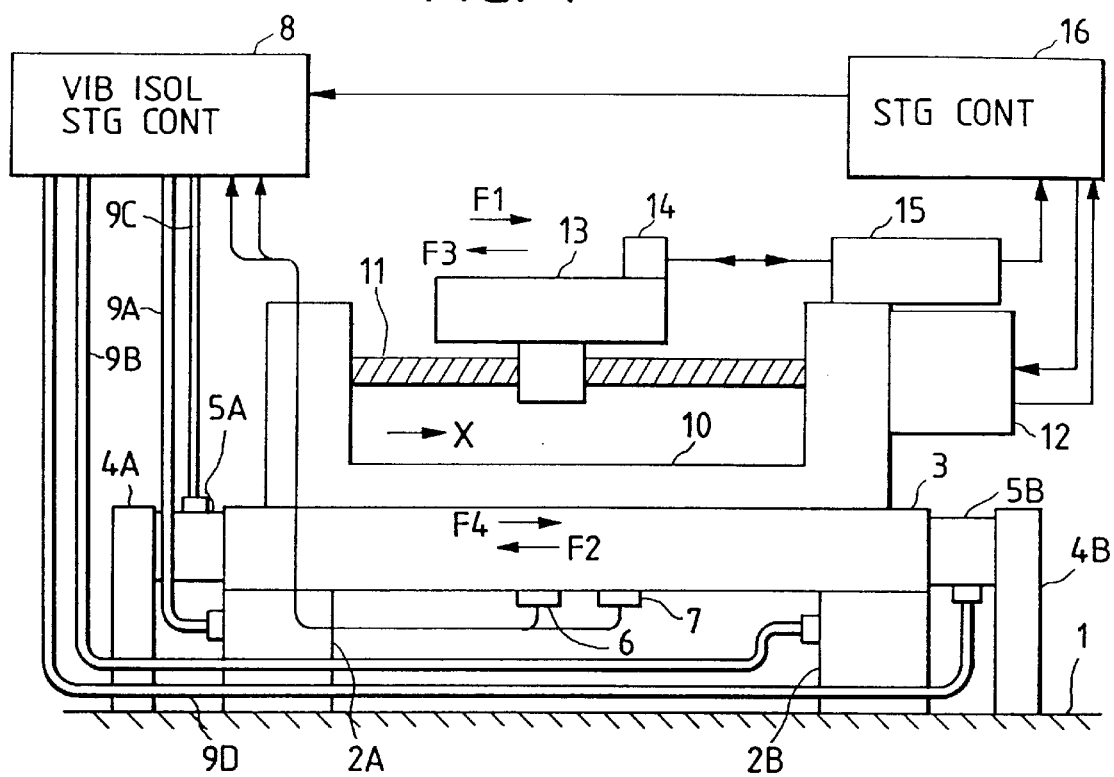
FIG. 1 shows a configuration of an embodiment of a staging apparatus of the present invention.

FIG. 1 shows a mechanical unit for the staging apparatus of the present embodiment. In FIG. 1, a base (fixed base) 3 is supported on a floor 1 through air dampers 2A and 2B. Supports 4A and 4B are provided on the floor 1 at the opposite sides of the base 3 and air dampers 5A and 5B are inserted between the supports 4A and 4B and the base 3. A gradient sensor 6 and an acceleration sensor 7 are mounted at the bottom of the base 3 and detection signals from the gradient sensor 6 and the acceleration sensor 7 are supplied to an anti-vibration table control unit 8, which controls pressures of gas in the air dampers 2A, 2B, 5A and 5B through air tubes 9A–9D, respectively.

A U-shaped support frame 10 is fixed on the base 3 and a lead screw 11 is rotatably mounted in the support frame 10 in parallel with a surface of the base 3, and the lead screw 11 is connected to a drive shaft of a drive motor 12 fixed to one side of the support frame 10. A stage 13 is meshed with the lead screw 11, and the stage 13 is moved in an X direction along the lead screw 11 by rotating the lead screw 11 by the drive motor 12. An object to be positioned is mounted on the stage 13.

A movable mirror 14 is mounted at an end of an upper surface of the stage 13, and a laser interferometer 15 is fixed to a top of one side of the support frame 10 to face the movable mirror 14. A laser beam is applied to the movable mirror 14 from the laser interferometer 15 in parallel to the X axis and the laser beam reflected from the movable mirror 14 is sensed by the laser interferometer 15 to detect an X axis coordinate of the stage 13 by the laser interferometer 15. The coordinate measured by the laser interferometer 15 is supplied to a stage control unit 16 which sets the position of the stage 13 to a position commanded from a main control unit (see FIG. 2) through the drive motor 12 based on the supplied coordinate.

A tachogenerator which generates a signal representing an angular velocity of the drive shaft is provided in the drive motor 12, and the angular velocity generated by the tachogenerator is supplied to the stage control unit 16, which detects an angular velocity of the drive shaft of the drive motor 12 and a velocity of the stage 13 based on the angular velocity signal to control the velocity of the stage 13.

Figure 2:
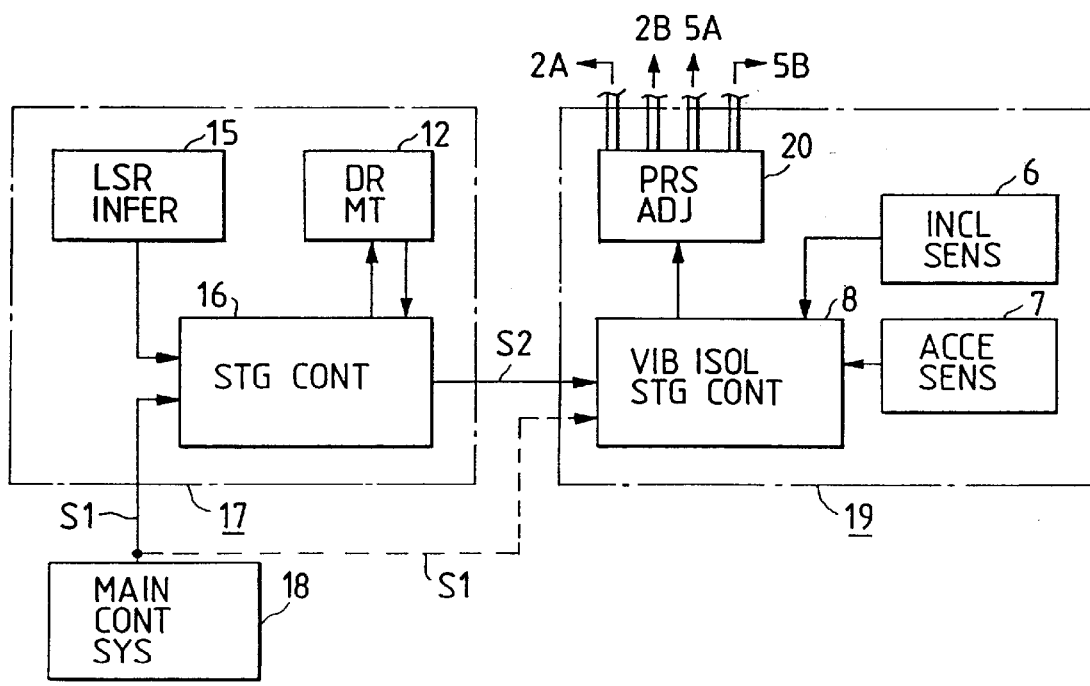
FIG. 2 shows a block diagram of a configuration of a control unit of the staging apparatus of FIG. 1.

Referring to FIG. 2, the control unit of the staging apparatus of the present embodiment is explained. In FIG. 2, the drive motor 12, the laser interferometer 15 and the stage control unit 16 form the stage control unit 17, and the gradient sensor 6, the acceleration sensor 7, a pressure regulator 20 and the anti-vibration table control unit 8 form an anti-vibration control unit 19. The pressure regulator 20 regulates the pressures of gas in the air dampers 2A, 2B, 5A and 5B through the air tubes by a command from the anti-vibration table control unit 8. It also supplies positioning information S1 of the stage 13 of FIG. 1 to the stage control unit 16 in the stage control unit 17 from a main control unit 18 which controls the operation of the entire apparatus. The positioning information S1 includes target stop position information in stepping the stage 13, timing information for operating the stage 13 and information on the velocity of the stage (for example, information on the magnitude of the drive voltage supplied to the drive motor 12).

In the present embodiment, displacement information S2 of the stage 13 is supplied to the anti-vibration control unit 8 in the anti-vibration table control unit 19 from the stage control unit 16. The displacement information S2 of the stage 13 includes an X axis coordinate of the stage 13 measured by the laser interferometer 15, X axis velocity information of the stage 13 based on the angular velocity information generated from the drive motor 12, and information on the velocity of the stage in the stage positioning information S1 supplied to the anti-vibration table control unit through the stage control unit 16 (for example, the information on the magnitude of the drive voltage supplied to the drive motor 12). The anti-vibration table control unit 8 predicts the vibration which may be generated in the base 3 by the movement of the stage 13 based on the supplied displacement information S2 and regulates the pressures of gas in the air dampers 2A, 2B, 5A and 5B through the pressure regulator 20.

The prediction of the vibration generated in the base 3 based on the X axis coordinate of the stage measured by the laser interferometer 15 and the X axis velocity information of the stage 13 based on the angular velocity information generated from the drive motor 12 is now explained. In this case, the coordinate of the laser interferometer 15 and the velocity information of the drive motor 12 are sampled at a constant interval to determine the acceleration information of the stage, the vibration generated in the base is predicted from the acceleration information, and an external force to suppress the vibration is applied to the base 3 through the air dampers 2A, 2B, 5A and 5B. Accordingly, the sampling period is preferably sufficiently smaller than a time from the generation of the acceleration to the generation of the vibration in the base.

Figure 3:
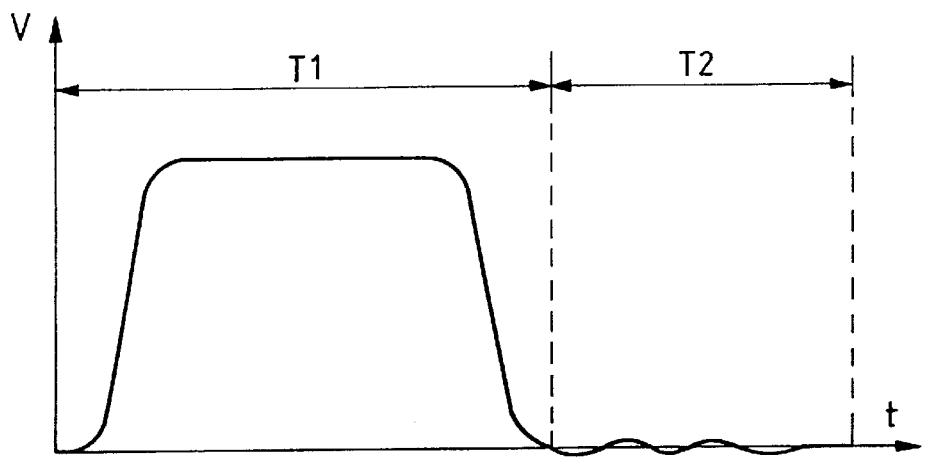
FIG. 3 shows an example of a speed characteristic of a stage of the staging apparatus of FIG. 1.

An example of the positioning operation of the staging apparatus of the present embodiment is now explained. In this case, assuming that the stage 13 of FIG. 1 is stepped, the velocity control is effected until the stage 13 reaches immediately before a target position, and the final positioning is effected by the position control. As shown in FIG. 3, the velocity V of the stage 13 changes abruptly in a period T1 and changes gently and in a small velocity range in the following period T2. Since the vibration is usually generated when the velocity or the acceleration changes, it may be considered that the vibration of the base 3 which is the object of the anti-vibration is primarily generated when the stage 13 is moved in the period T1.

Since the velocity control is effected in the period T1, the movement of the stage 13 may be predicted based on the information on the velocity of the stage in the stage positioning information S1. Accordingly, the vibration predicted in the anti-vibration control unit 8 is predicted based on the displacement information S2 supplied from the stage control unit 16 (in this case the information on the velocity in the stage positioning information S1), and the pressure regulator 20 is controlled to prevent the vibration. Specifically, as shown in FIG. 1, when the stage 13 starts the movement along the X axis (rightward in FIG. 1), it is predicted that an X axis force F1 acts on the stage 13 and a reaction (counterforce) F2 (=−F1) acts on the base 3. As a result, when the stage 13 starts to move, the pressure in the left air damper 5A is set larger than the pressure in the right air damper 5B to apply to the base 3 an external force for suppressing the vibration of the base in accordance with the acceleration of the stage so that the vibration of the base 3 when the stage 13 starts to move along the X axis is reduced. When the stage 13 is to be stopped, it is predicted that a force F3 which is opposite to F1 acts on the stage 13 along the X axis and a reaction F4 (=−F3) acts on the base 3. Thus, when the stage 13 is to be stopped, the pressure in the right air damper 5B is set larger than the pressure in the left air damper 5A to apply to the base 3 an external force for suppressing the vibration of the base in accordance with the acceleration of the stage so that the vibration of the base 3 when the stage 13 enters the stop operation is reduced. The information on the velocity of the stage in the positioning information S1 may be directly applied from the main control unit 18 to the anti-vibration table control unit 8.

Since the gradient sensor 6 and the acceleration sensor 7 are mounted on the base 3, the anti-vibration control by the feedback of the detection signals to the anti-vibration table control unit 8 and the anti-vibration control by the prediction of the vibration generated based on the positioning information S1 and the displacement information S2 may be conducted in parallel. Thus, small vibration may be quickly suppressed while the generation of large vibration is suppressed. Accordingly, the settling time of the positioning of the stage is further reduced than that attained by the anti-vibration control by merely feeding back the direction signals of the gradient sensor 6 and the acceleration sensor 7, and the positioning performance of the stage 13 is further improved.

On the ther hand, since the position control is effected during the period T2, it is difficult to predict the movement of the stage 13. However, the change of the acceleration in this range is small and the vibration of the base 3 generated by the behavior of the stage 13 in this range is small. Accordingly, in the period T2 in which the position control is effected, sufficient control may be attained by simply feeding back the detection signals of the gradient sensor 6 and the acceleration sensor 7.

In FIG. 1, the staging apparatus has only one drive shaft (X axis). In a staging apparatus having multiple shafts such as two shafts or three shafts, the number of anti-vibration air dampers may be increased in accordance with theonumber of drive shafts. Where a plurality of drive shafts are concurrently linked, the air dampers corresponding to the plurality of shafts may be driven in parallel. If the vibration generated varies with the position (stepping position) in spite of the fact that the stage 13 is moved (stepped) in the same manner, a correction may be made in accordance with the position of the stage 13.

For example, for a given amount of movement of the stage 13, the vibration of the base 3 may be different between the movement of the stage 13 at a periphery of the base 3 and the movement of the stage 13 at a center of the base 3. A relation between the vibration of the stage 13 by the stepping of the stage 13 and the position of the base 3 is stored as table information and a correction is made for the amount of control of the pressure control unit 20 based on the table information.

Figure 4:
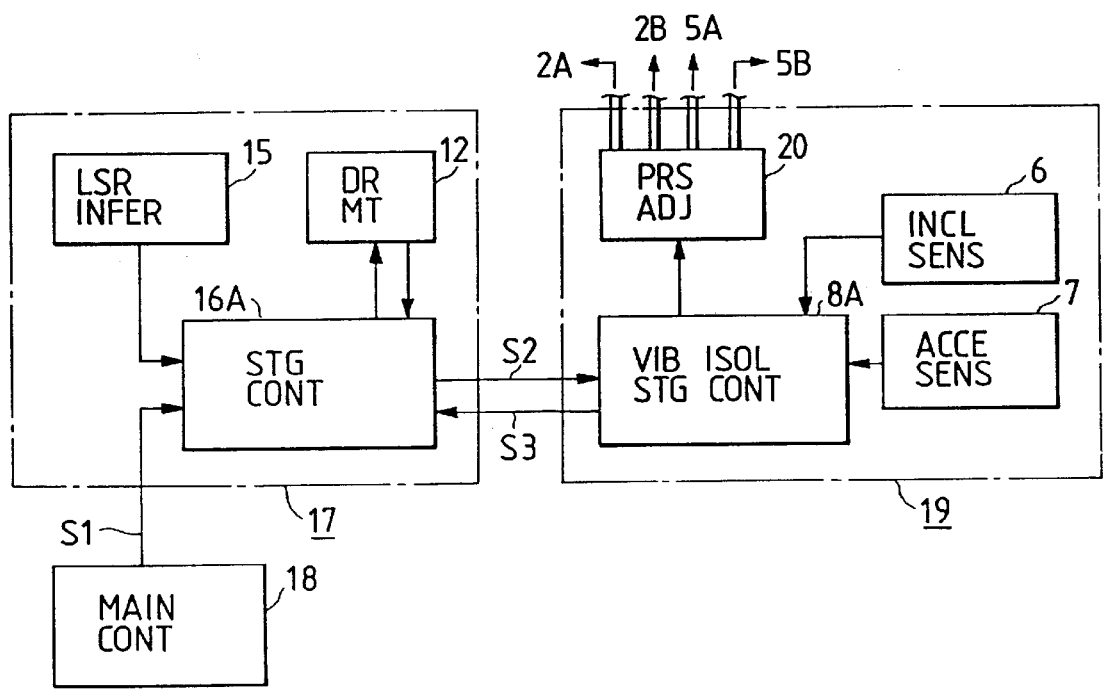
FIG. 4 shows a block diagram of a configuration of a control unit of the staging apparatus in accordance with another embodiment of the present invention.

An other embodiment of the present invention is now explained with reference to FIG. 4. In the present embodiment, the anti-vibration table control unit 8 and the stage control unit 16 of FIG. 2 are replaced by an anti-vibration table control unit 8A and a stage control unit 16A, respectively. In FIG. 4, the elements corresponding to those of FIG. 2 are designated by the like numerals and the explanation there of is omitted.

FIG. 4 shows a control unit of the staging apparatus of the present embodiment. In FIG. 4, the positioning information S1 of the stage 13 of FIG. 1 is supplied from the main control unit 18 to the stage control unit 16A in the stage control unit 17, and the displacement information S2 of the stage 13 is supplied from the stage control unit 16A to the anti-vibration control unit 8A in the anti-vibration control unit 19. In the present embodiment, the anti-vibration information S3 is supplied from the anti-vibration table control unit 8A to the stage control unit 16A. The anti-vibration information S3 includes the detection signals of the gradient sensor 6 and the anti-vibration sensor 7 and the control signal supplied from the anti-vibration table control unit 8A to the pressure regulator 20. The communication of ther signals is similar to that of the embodiment of FIGS. 1 and 2.

In conducting the positioning in the staging apparatus of the present embodiment, the staging control unit 16A positions the stage 13 through the drive motor 12 based on the positioning information S1 of the stage 13, the X coordinate of the stage 13 measured by the laser interferometer 15, and the angular velocity information supplied from the drive motor 12 and the anti-vibration information S3. If it is determined from the detection signal from the acceleration sensor 7 that the vibration of the base 3 is not suppressed, the stage control unit 16A suppresses the positioning of the stage 13 until the vibration is suppressed so that the positioning precision of the stage 13 is improved.

In the period T2, the vibration of the base 3 is detected by the detection signals from the gradient sensor 6 and the acceleration sensor 7, the vibration of the stage 13 generated by the vibration is predicted, and a stage drive amount to suppress the vibration of the stage 13 is supplied to suppress the vibration of the stage 13. The time interval to sample the detection signals from the gradient sensor 6 and the acceleration sensor 7 is preferably shorter than the time from the generation of the vibration in the base 3 to the propagation of the vibration to the stage 13.

The suppression amount of the vibration of the base 3 from the acceleration sensor 7 and the drive amount of the motor 12 are stored and the drive amount of the motor 12 which minimizes the vibration is learnt. The result of the learning may be used as the drive amount of the motor 12 in the next shot or it may be added as one of parameters in determining the drive amount. Specifically, the recent information of the acceleration sensor 7 during the movement of the stage is converted to a positional deviation amount and it is stored. In the next stage movement, a drive amount to cancel the positional deviation may be added to the drive amount for the stage movement.

In the above embodiment, the air dampers are used as means for suppressing the vibration of the base 3. Alternatively, non-contact actuation means of a linear motor type or an anti-vibration spring or an oil pressure damper which can adjust a generated force may be used.

The staging apparatus of the above embodiments are applicable to not only to the stage of the projection exposure apparatus and the precise measurement equipment but also to an apparatus having a stage which requires a high positioning precision. Thus, the present invention is not limited to the above embodiments but may take various constructions without departing from the scope of the invention.

What is claimed is:

1. A staging apparatus which performs position control of a stage by using an interferometer, comprising:
   a base which supports said stage movably;
   a vibration suppressing device which suppresses a vibration generated in said base;
   a driving device which drives said stage, based on predetermined drive information on said position control, and position information of said stage obtained by said interferometer; and a displacement measuring device which measures an amount relating to displacement of said base, wherein said vibration suppressing device has a first control mode in which said vibration is suppressed based on a predicted vibration of said base, and a second control mode in which said vibration is suppressed based on information from said displacement measuring device, and said vibration suppressing device uses said second mode selectively.

2. A staging apparatus according to claim 1, wherein said vibration suppressing device includes at least one damping device disposed between said base and a foundation on which said base is settled, and controls a damping characteristic of said at least one damping device, based on said drive information.

3. A staging apparatus according to claim 2, wherein said damping device suppresses a vibration in a direction which is generally perpendicular to a plane through which said base and said stage are opposed to each other.

4. A staging apparatus according to claim 2, wherein said damping device suppresses a vibration in a direction which is generally perpendicular to a plane through which said base and said stage are opposed to each other.

5. A staging apparatus according to claim 4, wherein said vibration suppressing device includes a vibration suppressing control device which predicts a vibration of said base, based on information on said position control which is stored in said driving device.

6. A staging apparatus according to claim 1, wherein said vibration suppressing device includes a vibration suppressing control device which predicts a vibration of said base, based on information on said position control which is stored in said driving device.

7. A staging apparatus according to claim 1, wherein said vibration suppressing device generates force to suppress the vibration by using air dampers.

8. A staging apparatus which performs position control of a stage by using an interferometer, comprising:

a driving device which drives said stage, based on predetermined drive information on said position control, and position information of said stage obtained by said interferometer, a vibration suppressing device which suppresses a vibration which is generated as said stage moves; and a measuring device which measures information on a vibration which is generated by movement of said stage while said stage moves, wherein said vibration suppressing device has a first control mode in which said vibration is suppressed based on said drive information, and a second control mode in which said vibration is suppressed based on information from said measuring device, and said vibration suppressing device uses said second control mode selectively.

9. A staging apparatus according to claim 8, wherein said vibration suppressing device suppresses said vibration, based on said drive information of said stage, and a velocity of said stage.

10. A staging apparatus according to claim 9, wherein said vibration suppressing device includes a vibration suppressing control device which predicts a vibration of a base which supports said stage movably, based on information on said position control which is stored in said driving device.

11. A staging apparatus according to claim 8, wherein said vibration suppressing device includes a vibration suppressing control device which predicts a vibration of a base which supports said stage movably, based on information on said position control which is stored in said driving device.

12. A staging apparatus according to claim 8, wherein said vibration suppressing device generates force to suppress the vibration by using air dampers.

13. A method for manufacturing a staging apparatus which performs position control of a stage by using an interferometer, comprising:

providing a base which supports said stage movably;

connecting, to said base, a vibration suppressing device which suppresses a vibration generated in said base;

connecting, to said stage, a driving device which drives said stage, based on predetermined drive information on said position control, and position information of said stage obtained by said interferometer; and connecting to said vibration suppressing device, a displacement measuring device which measures an amount relating to displacement of said base, wherein said vibration suppressing device has a first control mode in which said vibration is suppressed based on a predicted vibration of said base, and a second control mode in which said vibration is suppressed based on information from said displacement measuring device, and said vibration suppressing device uses said second control mode selectively.

14. A method according to claim 13, wherein said vibration suppressing device includes at least one damping device disposed between said base and a foundation on which said base is settled, and controls a damping characteristic of said at least one damping device, based on said drive information.

15. A method according to claim 14, wherein said vibration suppressing device suppresses a vibration in a direction which is generally perpendicular to a plane through which said base and said stage are opposed to each other.

16. A method according to claim 15, wherein said vibration suppressing device includes a vibration suppressing control device which predicts a vibration of said base, based on information on said position control which is stored in said driving device.

17. A method according to claim 13, wherein said vibration suppressing device suppresses a vibration in a direction which is generally perpendicular to a plane through which said base and said stage are opposed to each other.

18. A method according to claim 13, wherein said vibration suppressing device includes a vibration suppressing control device which predicts a vibration of said base, based on information on said position control which is stored in said driving device.

19. A method according to claim 13, wherein said vibration suppressing device generates force to suppress the vibration by using air dampers.

20. A method for manufacturing a staging apparatus which performs position control of a stage by using an interferometer, comprising:

connecting, to said interferometer, a driving device which drives said stage, based on predetermined drive information on said position control, and position information of said stage obtained by said interferometer; and connecting, to said driving device, a vibration suppressing device which suppresses a vibration which is generated as said stage moves, based on said drive information, wherein said vibration suppressing device includes a measuring device which measures information on a vibration which is generated by movement of said stage while said stage moves, and wherein said vibration suppressing device has a first control mode in which said vibration is suppressed based on said drive information, and a second control mode in which said vibration is suppressed based on information from said measuring device, and said vibration suppressing device uses said second control mode selectively.

21. A method according to claim 20, wherein said vibration suppressing device suppresses said vibration, based on said drive information of said stage, and a velocity of said stage.

22. A method according to claim 21, wherein said vibration suppressing device includes a vibration suppressing control device which predicts a vibration of a base which supports said stage movably, based on information on said position control which is stored in said driving device.

23. A method according to claim 20, wherein said vibration suppressing device includes a vibration suppressing control device which predicts a vibration of a base which supports said stage movably, based on information on said position control which is stored in said driving device.

24. A method according to claim 20, wherein said vibration suppressing device generates force to suppress the vibration by using air dampers.

25. A staging apparatus which performs position control of a stage by using an interferometer, comprising:
a base which supports said stage movably;
a vibration suppressing device which suppresses a vibration generated in said base;
a driving device which drives said stage, based on predetermined drive information on said position control, and position information of said stage obtained by said interferometer; and
a displacement measuring device which measures an amount relating to displacement of said base,
wherein said vibration suppressing device has a first control mode in which said vibration is suppressed based on a predicted vibration of said base, and a second control mode in which said vibration is suppressed based on information from said displacement measuring device, and upon effecting the final positioning of said stage, said vibration suppressing device shifts from a first control state using both said first and second control modes to a second control state using only said second control mode.

26. A staging apparatus according to claim 25, wherein said vibration suppressing device includes at least one damping device disposed between said base and a foundation on which said base is settled, and controls a damping characteristic of said at least one damping device, based on said drive information.

27. A staging apparatus according to claim 27, wherein said damping device suppresses a vibration in a direction which is generally perpendicular to a plane through which said base and said stage are opposed to each other.

28. A staging apparatus according to claim 27, wherein said vibration suppressing device includes a vibration suppressing control device which predicts a vibration of said base, based on information on said position control which is stored in said driving device.

29. A staging apparatus according to claim 25, wherein said vibration suppressing device includes a vibration suppressing control device which predicts a vibration of said base, based on information on said position control which is stored in said driving device.

30. A staging apparatus according to claim 25, wherein a velocity of said stage is controlled in said first control state, and a position of said stage is controlled in said second control state.

31. A staging apparatus according to claim 25, wherein said vibration suppressing device generates force to suppress the vibration by using air dampers.

32. An exposure apparatus that includes a staging apparatus which performs position control of a stage by using an interferometer, comprising:
a base which supports said stage movably;
a vibration suppressing device which suppresses a vibration generated in said base;
a driving device which drives said stage, based on predetermined drive information on said position control, and position information of said stage obtained by said interferometer; and
a displacement measuring device which measures an amount relating to displacement of said base,
wherein said vibration suppressing device has a first control mode in which said vibration is suppressed based on a predicted vibration of said base, and a second control mode in which said vibration is suppressed based on information from said displacement measuring device, and upon effecting the final positioning of said stage, said vibration suppressing device shifts from a first control state using both said first and second control modes to a second control state using only said second control mode.

33. A method for manufacturing a staging apparatus which performs position control of a stage by using an interferometer, comprising:
providing a base which supports said stage movably;
connecting, to said base, a vibration suppressing device which suppresses a vibration generated in said base;
connecting, to said stage, a driving device which drives said stage, based on predetermined drive information on said position control, and position information of said stage obtained by said interferometer; and
connecting, to said vibration suppressing device, a displacement measuring device which measures an amount relating to displacement of said base,
wherein said vibration suppressing device has a first control mode in which said vibration is suppressed based on a predicted vibration of said base, and a second control mode in which said vibration is suppressed based on information from said displacement measuring device, and upon effecting the final positioning of said stage, said vibration suppressing device shifts from a first control state using both said first and second control modes to a second control state using only said second control mode.

34. A method according to claim 33, wherein said vibration suppressing device includes at least one damping device disposed between said base and a foundation on which said base is settled, and controls a damping characteristic of said at least one damping device, based on said drive information.

35. A method according to claim 34, wherein said damping device suppresses a vibration in a direction which is generally perpendicular to a plane through which said base and said stage are opposed to each other.

36. A method according to claim 35, wherein said vibration suppressing device includes a vibration suppressing control device which predicts a vibration of said base, based on information on said position control which is stored in said driving device.

37. A method according to claim 33, wherein said vibration suppressing device includes a vibration suppressing control device which predicts a vibration of said base, based on information on said position control which is stored in said driving device.

38. A method according to claim 37, wherein a velocity of said stage is controlled in said first control state, and a position of said stage is controlled in said second control state.

39. A method according to claim 33, wherein said vibration suppressing device generates force to suppress the vibration by using air dampers.

40. An exposure apparatus which forms a pattern on a substrate, including a staging apparatus which performs position control of a stage for said substrate by using an interferometer, comprising:
- a base which supports said stage movably;
- a vibration suppressing device which suppresses a vibration generated in said base;
- a driving device which drives said stage, based on predetermined drive information on said position control, and position information of said stage obtained by said interferometer; and
- a displacement measuring device which measures an amount relating to displacement of said base,
- wherein said vibration suppressing device has a first control mode in which said vibration suppressing device is controlled based on a predicted vibration of said base, and a second control mode in which said vibration suppressing device is controlled based on information from said displacement measuring device, and said vibration suppressing device uses said second mode selectively.

41. An exposure apparatus which forms a pattern on a substrate, including a staging apparatus which performs position control of a stage for said substrate by using an interferometer, comprising:
- a driving device which drives said stage, based on predetermined drive information on said position control, and position information of said stage obtained by said interferometer,
- a vibration suppressing device which suppresses a vibration which is generated as said stage moves, based on said drive information; and
- a measuring device which measures information on a vibration which is generated by movement of said stage while said stage moves,
- wherein said vibration suppressing device has a first control mode in which said vibration is suppressed based on said drive information, and a second control mode in which said vibration is controlled based on information from said measuring device, and said vibration suppressing device uses said second control mode selectively.

42. A method for manufacturing an exposure apparatus which forms a pattern on a substrate, said method including manufacturing a staging apparatus which performs position control of a stage for said substrate by using an interferometer, comprising:
- providing a base which supports said stage movably;
- connecting, to said base, a vibration suppressing device which suppresses a vibration generated in said base;
- connecting, to said stage, a driving device which drives said stage, based on predetermined drive information on said position control, and position information of said stage obtained by said interferometer; and
- connecting to said vibration suppressing device, a displacement measuring device which measures an amount relating to displacement of said base,
- wherein said vibration suppressing device has a first control mode in which said vibration suppressing device is controlled based on a predicted vibration of said base, and a second control mode in which said vibration suppressing device is controlled based on information from said displacement measuring device, and said vibration suppressing device uses said second control mode selectively.

43. A method for manufacturing an exposure apparatus which forms a pattern on a substrate, said method including manufacturing a staging apparatus which performs position control of a stage for said substrate by using an interferometer, comprising:
- connecting, to said interferometer, a driving device which drives said stage, based on predetermined drive information on said position control, and position information of said stage obtained by said interferometer; and
- connecting, to said driving device, a vibration suppressing device which suppresses a vibration which is generated as said stage moves, based on said drive information,
- wherein said vibration suppressing device includes a measuring device which measures information on a vibration which is generated by movement of said stage while said stage moves, and wherein said vibration suppressing device has a first control mode in which said vibration is suppressed based on said drive information, and a second control mode in which said vibration is controlled based on information from said measuring device, and said vibration suppressing device uses said second control mode selectively.

* * * * *